United States Patent [19]

Heimen

[11] 4,404,730
[45] Sep. 20, 1983

[54] METHOD OF PRODUCING LUMINESCENT OR LASER DIODES HAVING AN INTERNALLY LIMITED LUMINESCENT SURFACE

[75] Inventor: Jochen Heimen, Haar, Fed. Rep. of Germany

[73] Assignee: Siemens Aktiengesellschaft, Berlin & Munich, Fed. Rep. of Germany

[21] Appl. No.: 349,376

[22] Filed: Feb. 16, 1982

[30] Foreign Application Priority Data

Feb. 17, 1981 [DE] Fed. Rep. of Germany ....... 3105786

[51] Int. Cl.³ .......................................... H01L 21/208
[52] U.S. Cl. ................. 29/569 L; 29/576 E; 148/171; 148/172; 372/48
[58] Field of Search .......... 29/569 L, 576 E; 148/171, 172; 372/48

[56] References Cited

U.S. PATENT DOCUMENTS

| | | | |
|---|---|---|---|
| 3,891,478 | 6/1975 | Ladany et al. | 148/171 |
| 3,983,510 | 9/1976 | Hayashi et al. | 148/171 X |
| 4,033,796 | 7/1977 | Burnham et al. | 148/171 X |
| 4,149,175 | 4/1979 | Inoue et al. | 357/18 |
| 4,178,195 | 12/1979 | Hovel et al. | 148/171 |
| 4,188,244 | 2/1980 | Itoh et al. | 29/569 L X |
| 4,194,933 | 3/1980 | Logan et al. | 29/576 E |
| 4,213,805 | 7/1980 | Tsukada | 148/172 X |
| 4,215,319 | 7/1980 | Botez | 148/171 X |
| 4,255,206 | 3/1981 | Endler | 148/171 |
| 4,372,791 | 2/1983 | Hsieh | 148/172 X |

Primary Examiner—G. Ozaki
Attorney, Agent, or Firm—Hill, Van Santen, Steadman & Simpson

[57] ABSTRACT

A luminescent or laser diode having a pn-junction surrounding an internally limited luminescent surface area and limiting current flow in the diode is produced by etching a select semiconductor substrate so as to produce a mesa dimensioned accordingly to the required luminescent surface area and without interruption epitaxially depositing and structuring required individual semiconductor material layers on the surfaces of the substrate and mesa to achieve the diode.

9 Claims, 9 Drawing Figures

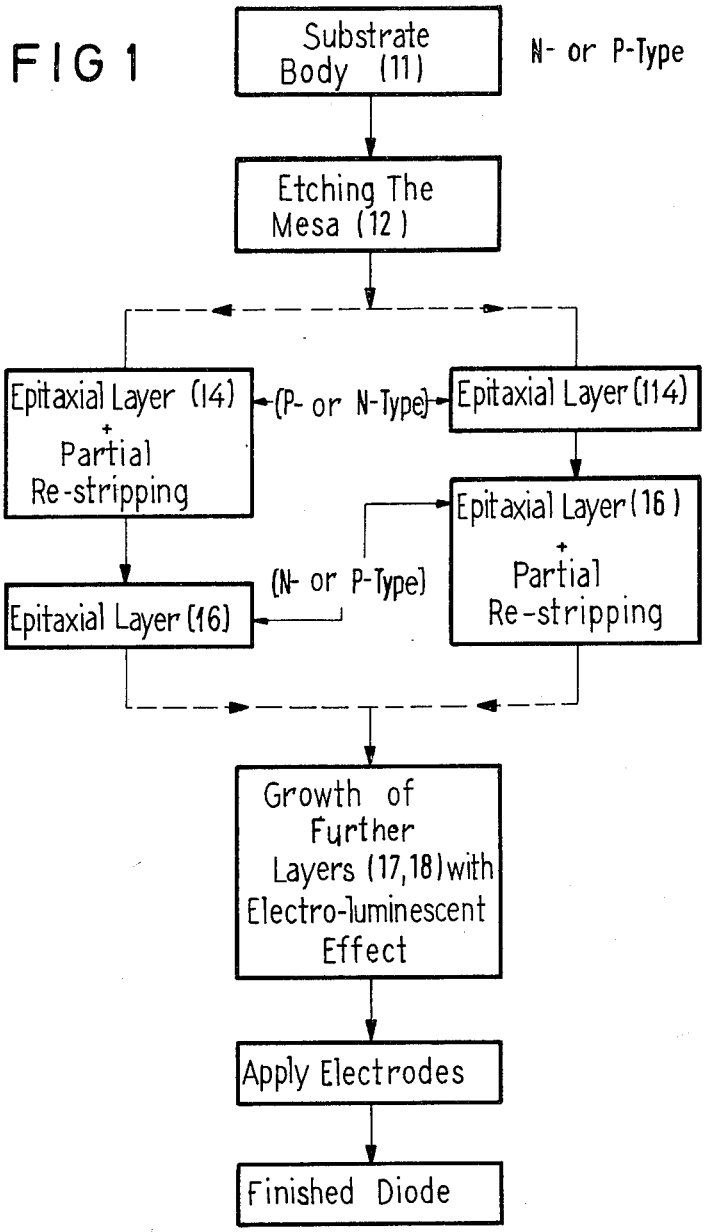

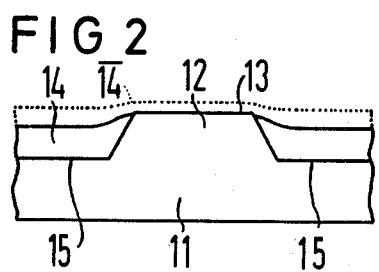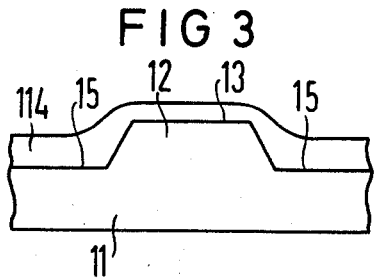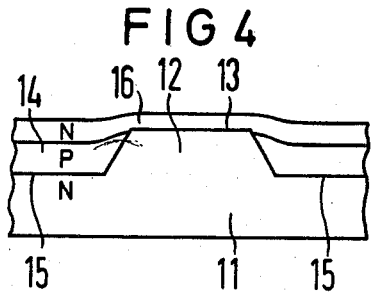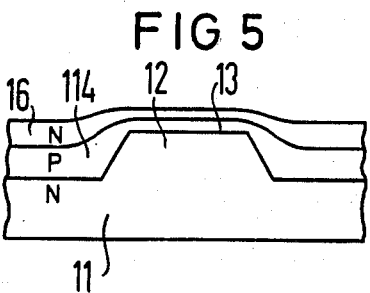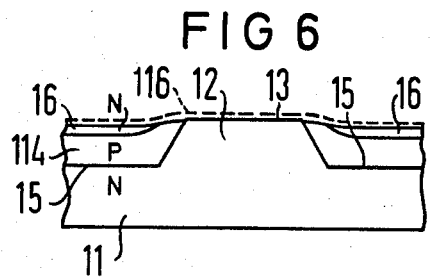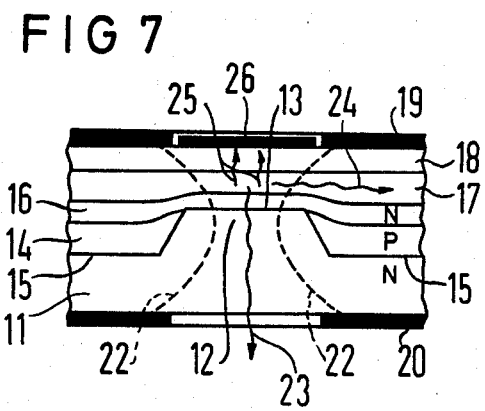

METHOD OF PRODUCING LUMINESCENT OR LASER DIODES HAVING AN INTERNALLY LIMITED LUMINESCENT SURFACE

BACKGROUND OF THE INVENTION

1. Field of the Invention

The invention relates to a pn-luminescent or laser diode having an emission area in the semiconductor body of the diode defined by lateral boundries of a pn-junction and somewhat more particularly to a method of producing such diodes wherein a plurality of semiconductor layers are epitaxially deposited on a substrate body or on one another and electrodes are provided thereon.

2. Prior Art

The production of luminescent diodes having a laterally tightly limited area of a region (layer) present within the semiconductor body for light emission itself and which can be activated for radiation generation is known. In accordance with the prior art, the limitation of such area in the semiconductor body occurs by providing a layer sequence having a multiple alternating conductivity and which includes at least one inhibiting pn-junction. This inhibiting junction of the layer sequence is, however, omitted at the location where the limited, activated zone or luminescent surface area is to be present in the semiconductor body. A method of producing such known luminescent diode consists essential of a first step in which an epitaxial growth or deposition of at least one semiconductor layer (which can be doped to exhibit a desired conductivity) on the substrate body occurs. Next, the coated substrate body is removed from the epitaxy apparatus and is subjected to an etching process in which a portion of the epitaxially deposited layer is removed. Then the resultant substrate body is again placed into the epitaxy apparatus and further necessary layers, known per se, of the remaining layer sequence are deposited on the layer already applied before the intervening etching process and on the surface areas which were generated during the etching step. In this regard, attention is directed to an article by J. Heinen et al in "NTZ," Vol. 31, No. 2, (1978) pages 129-130, particularly FIG. 2 thereof. This type of known luminescent diode, just like the diode produced in accordance with the principles of the invention, is, because of the laterally confining luminescent surface therein, particularly well suited for coupling to a glass fiber for optical beam transmission (as is illustrated in FIG. 1 of the above-referenced publication). The structure illustrated at FIG. 2 of this publication shows the presence of a pn-junction which is situated next to or around an etched depression, there having a 50 μm diameter. This etched area or depression determines and defines the earlier discussed active emission zone or the luminous surface of the diode. The remaining layers comprised of n-gallium-aliminum-arsenide and p-gallium-aluminum-arsenide shown at FIG. 2 of this publication form the further known layer sequence. This layer sequence can also be provided for diodes manufactured in accordance with the principles of the invention. Analogous steps for providing the electrodes for power supply shown there can also be used in the practice of the invention.

SUMMARY OF THE INVENTION

The invention provides a method of producing luminescent or laser diodes, which are known per se in the prior art, whereby a simplified manufacturing sequence is attained and which avoids the necessity of interrupting the epitaxial process, as in the prior art.

In accordance with a first embodiment of the principles of the invention, luminescent or laser diodes of the type above described are produced by (1) generating a mesa having side surfaces and a top plane surface dimensioned according to a desired luminescent surface area on a select semiconductor substrate of a first conductivity type; (2) epitaxially depositing a first layer of a semiconductor material of a second, opposing conductivity type relative to that of the substrate, onto the substrate surface and on the mesa surfaces in such a manner that this layer is generated with a lesser thickness in the area of the mesa surfaces relative to the thickness thereof on the substrate surfaces located around the mesa; (3) removing a sufficient portion of this first layer so that at least the entire mesa plane surface is uncovered; (4) epitaxially depositing a second layer of a semiconductor material of the first conductivity type on the first layer and on the uncovered plane surface of the mesa; and (5) thereafter applying a layer sequence required for luminescent or laser diodes known per se and providing electrodes via known process steps.

In accordance with a second embodiment of the principles of the invention, luminescent or laser diodes of the type above-described are produced by (1) generating a mesa having side surfaces and a top plane surface dimensioned according to a desired luminescent surface area on a select semiconductor substrate of a first conductivity type; (2) epitaxially depositing a first layer cmposed of a further semiconductor material of an opposing, second conductivity type relative to that of the substrate, onto the surface of the substrate and the mesa; (3) epitaxially depositing a second layer of a semiconductor material of the first conductivity type onto the first layer in such a manner that the second layer is generated with a lesser thickness in the area of the mesa surfaces relative to the thickness thereof on the substrate surface; (4) removing a sufficient portion of the second layer and first layer so that at least the entire area of the mesa plane surface is uncovered; and (5) thereafter applying a layer sequence required for luminescent or laser diodes known per se and providing electrodes via known process steps.

In either of the above embodiments of the invention, mesa generation can occur by etching with the use of a photo sensitive resist to generate an appropriate etch mask. Further, in either of these embodiments, the removal or stripping of a previously deposited semiconductor layer can occur by erosion utilizing an additional etching melt. Yet further, the removal or stripping of a previously epitaxially deposited semiconductor layer can occur by temporarily increasing the temperature of the melt utilized in the preceding expitaxially deposition step so as to melt desired portions of the layer being removed. In conjunction with either embodiment of the invention, the removal or stripping of a previously epitaxially deposited semiconductor layer can occur by momentarily increasing the temperature of the melt from which the material of the subsequent layer (second layer) is to be deposited.

In either of the above embodiments, an identical step is to first undertake mesa generation, for example with a photo-lithographic etching technique before the execution of the necessary steps of epitaxial deposition or epitaxial growth of layers so that these latter steps can be executed in continuous succession without the semiconductor component, which is in the process of being produced, from having to be removed from the epitaxy device.

Thus, in accordance with the principles of the invention, a mesa having sloping side surfaces and a top plane surface is etched, instead of a trough or depression shown in the earlier-referenced prior art publication. A further feature of the invention is to deposit the first and/or second epitaxial semiconductor layer onto the substrate in such a manner that a layer thickness is generated in the area of the mesa which is thinner than in areas of the first and/or second layer which are adjacent to or which surround the mesa. A further important feature of the invention is to remove or strip previously deposited semiconductor layers in such a manner that the single or double layer structure on the plane surface of the mesa, which was deliberately produced so as to be relatively thin, is removed and the plane surface of the mesa (and thus a portion of the original substrate surface) is again uncovered. However, a layer structure having a pn-junction then exists on the surface areas of the substrates which surround the mesa. In the practice of the invention, a portion of the material forming the plane surface of the mesa can also be removed without further ado.

Further process steps used in the practice of the invention consists of measures which are conventional or standard per se for generating a layer sequence for luminescent or laser diodes, particularly for such diodes as have hetero-junction. The luminescent or laser-active zone lies in one or more layers or in a junction between two layers of such further layer sequence.

Because of the pn-junction surrounding the mesa produced in accordance with the principles of the invention, a flooding of the semiconductor body with electrical current can only exist in the cross-sectional area of the mesa. Shunts thereto are blocked by the pn-junction. As with prior art diodes, radiation in a diode produced in accordance with the simplified process of the invention, is thus only generated at a laterally tightly limited area of the diode.

BRIEF DESCRIPTION OF THE DRAWINGS

FIG. 1 is a schematic flow chart illustrating two alternative embodiments for practicing the principles of the invention;

FIGS. 2–6 are elevated partial schematic views of a substrate undergoing sequential processing steps in accordance with the principles of the invention;

FIG. 7 is an elevated partial schematic view of a finished diode produced in accordance with the principles of the invention;

DESCRIPTION OF THE PREFERRED EMBODIMENTS

Figure 8:
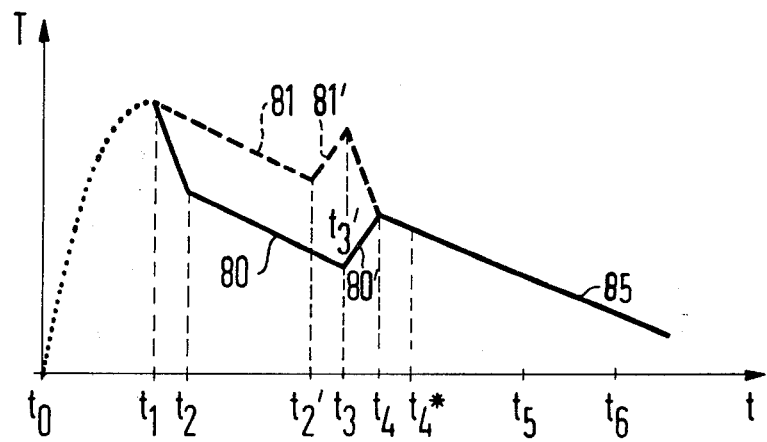
FIG. 8 is a graphical illustration of a timetemperature diagram useful in expanding certain features of the invention.

The flow chart illustrated at FIG. 1 proceeds from a substrate body 11 (FIGS. 2–7) which is composed of a semiconductor material of n- or p- conductivity type. A mesa 12 provided for individual diodes is produced by etching. The cross-sectional upper plane surface of the mesa is dimensioned in accordance with a desired luminous surface. Subsequently, a first layer 14 or 114 composed of an opposing conductivity type (relative to the conductivity of the substrate), i.e., p- or n- type semiconductor material, is applied. In one embodiment of the invention, (left-hand column of FIG. 1) this first epitaxial layer is applied in such a manner that it has a lower layer thickness on the mesa surfaces than on substrate surfaces surrounding the mesa. In the other embodiment of the invention (right-hand column of FIG. 1) a similar first epitaxial layer 114 can also have a lower thickness on the mesa surface but this is not absolutely necessary in this embodiment because of the subsequent processing steps. A lower layer thickness of the mesa surfaces is achieved by a relatively slow epitaxial growth, which in turn is achieved by a relatively slow chronological reduction of temperature of the melt solution from which the material forming this layer is deposited.

With the first embodiment of the invention, a portion of the material of this first layer can be, in a direct continuation of the deposition step, again stripped-off or removed. This occurs by a temporary increase of the melt temperature and of the epitaxial layer so that a re-absorption of the previously deposited material into the melt solution occurs. Because of the lower thickness of the layer area previously deposited on the plane surface of the mesa, the stripping eliminates all of the material of such first layer which had previously been deposited on the plane surface of the mesa or such material is redissolved or liquified until this condition is fully achieved.

In the next step, a second epitaxial layer 16 consisting of an opposing or second conductivity type (relative to that of the first layer 14 or 114) i.e., a n- or p- type semiconductor material, is epitaxially deposited. In other words, the second epitaxial layer is of the same conductivity type as the substrate. In the second embodiment of the invention (right-hand column of FIG. 1) a thinner layer area of this second layer is deposited on the plane surface of the mesa, relative to the thickness of material deposited on the substrate surfaces surrounding the mesa. This occurs by the slow epitaxial growth earlier described. A partial stripping or removal of this second layer 16 occurs in the same manner as was already described relative to the first embodiment of the invention. In the second embodiment, at least the plane surface of the mesa must likewise be uncovered by a stripping or material removal step to such a degree that all of the material of the first epitaxial layer 114 and of the second epitaxial layer 16 are removed from the top surface of the mesa. In the first embodiment, moreover, the second epitaxial layer can also be deposited so that it has a lower thickness on the upper surface of the mesa.

Because of this re-stripping or removal of material, all of the material of the second layer 16 over the mesa surface is of necessity removed (so that the material of the first layer 114 can likewise be removed). In instances where at the end of a material removal step, the melt solution containing material for the second layer 16 is not immediately removed, (for example by advancement of the apparatus shown at FIG. 9) and the temperature of the melt solution and the substrate body 11 is again lowered, material of layer 16 again grows, namely on the mesa surface 13. This, however, is advantageous because layer 16 and, above all, the mesa surface 13 are thus again covered with a further epitaxial layer 116, (FIG. 6) which is of the same conductivity type as the material of the substrate body 11 and thus the mesa surface 13. Such an epitaxial deposition sequence insures that the further epitaxial layer deposited thereon has even greater crystal perfection.

The re-stripping of a portion of the material of the first epitaxial layer 14 (in the first embodiment of the invention) can, as earlier explained, be executed with the melt solution from which this layer 14 was previously deposited. Alternatively (within the framework of the first embodiment of the invention) a melt solution can be utilized for this material removal step (re-stripping) which is subsequently utilized for the deposition or epitaxial growth of the following, second layer 16, namely, with a similar temporary temperature increase. A minor disadvantage of this alternative is that the material of the first layer 14 is then absorbed into the melt solution for the second layer 16, and both layer materials are doped with opposite conductivity-type dopants so that some mixing occurs.

Further, as a third alternative for the material removal step (useful in either embodiment of the invention) a separate etching or erosion melt can be utilized. This alternative is explained in greater detail below. With an etching melt, the temporary temperature increase required in the other material removal steps can be eliminated.

The results attained with the above-described method step is that a substrate body having an elevation corresponding to a mesa exists. Two layers 14 and 16 or 114 and 16 composed of semiconductor materials of mutually opposite conductivity types exist on the substrate body around the top surface of the mesa so that an inhibiting pn-junction exists about the mesa. In contrast thereto, there is either no material of a deposited layer (second embodiment of the invention) on the upper surface of the mesa or only material of the second epitaxial layer 16 (first embodiment of the invention) which, however, is of the same conductivity type as the substrate body, i.e., as the material of the mesa. Thus no pn-junction exists on the mesa.

In further processing of the structure resulting from the foregoing steps, further layers 17 and 18, in which electro-luminescence is to be effected with current passage, are then grown on either the second epitaxial layer 16 (first embodiment) or on the uncovered surface of the mesa and adjacent surfaces of the earlier deposited, partially removed epitaxial layers (second embodiment). For example, these further layers 17 and 18 are p- or n- and/or i- type layers and are composed, for example, of gallium-arsenide or indium-phosphide. Preferably, these further layers comprised so-called hetero-layers consisting of, for example, gallium-aluminum-arsenide or indium-gallium-arsenide-phosphide and can have thereon a layer consisting of p- or n- conductive gallium-aluminum-arsenide or indium-phosphide. Application of these further layers and their respective compositions for the desired effect, i.e., electro-luminescence, is known. A finished diode is obtained after application of electrodes, again in a known manner.

FIGS. 2 and 3 objectively illustrate a substrate under processing after the method steps of the third line or level of FIG. 1. That is, FIG. 2 shows the results in the first embodiment of the invention and FIG. 3 shows the results in the second embodiment of the invention.

In FIGS. 2 and 3, a portion of a substrate body 11 is illustrated as having a mesa 12 positioned on or at the substrate body 11 with an upper mesa surface 13. A first epitaxial layer 14 (FIG. 2) is shown extending only up to the mesa surface 13 so that the plane mesa surface 13 is free of the material forming layer 14. As will be recalled, in the first embodiment of the invention, layer 14 is initially epitaxially grown over the substrate surface and the mesa, as shown in dotted line $\overline{14}$, and is thereafter removed at least in the portion thereof above the mesa surface 13. In the second embodiment of the invention, as shown in FIG. 3, the first epitaxial layer 114 is generated so that a portion of layer 114 covers the mesa surface 13. As shown, the layer thickness of that portion of layer 114 which is over the mesa surface 13 can also be thinner than over the remaining substrate surface 15 surrounding the mesa 12. In the first embodiment, shown at FIG. 2, the originally generated layer thickness of epitaxial layer 14 over mesa surface 13 had to be less than that over the substrate surface 15, before the material removing step. The approximate maximum extent of this first epitaxial layer generated during epitaxial deposition or growth, before the re-stripping, is indicated by dotted line $\overline{14}$. By providing a lesser thickness of material forming the first layer over the mesa surface 13, it is guaranteed that after removal of a portion of the material of layer $\overline{14}$, a continuous layer 14 still remains over the substrate surface 15, although all of the material of layer $\overline{14}$ on the mesa surface 13 has been removed. This generation of layer 14 with an opening over surface 13 of mesa 12 thus occurs without the use of a mask.

FIG. 4 shows a structure attained after the fourth step or line of the first embodiment (left-hand column) in FIG. 1. The epitaxial layer 14 and the mesa surface 13 have already been covered with a second epitaxial layer 16. The respective conductivity of layers 14 and 16 is indicated for an exemplary embodiment, beginning with a n-conductive substrate. A respectively opposite conductivity order can also be utilized. The pn-junction between layer 14 and layer 16 is clearly visible. It can also be seen that no pn-junction exists between the mesa surface 13 and the layer 16.

FIG. 5 illustrates a structure attained after the deposition of a second epitaxial layer 16 in accordance with the second embodiment of FIG. 1 (right-hand column), prior to partial re-stripping. The mesa surface 13 is, at this stage, covered by both the first epitaxial layer 114 and the second epitaxial layer 16. It is necessary that the thickness of layer 16 is less in the area of the mesa surface 13 than in the area of the substrate surface 15.

In order to eliminate the pn-junction (between layer 14 and layer 16) present above the mesa surface 13, a material removal step (in accordance with the bottom of the fourth level, left-hand column of FIG. 1) is executed so as to attain the structure shown at FIG. 6. The material removal step or re-stripping of material from layers 16 and 114 is carried out until the mesa surface 13 is free of such material (layer 114) as could form a pn-junction with the material of the mesa 12 or, respectively, the substrate body 11.

In certain material removal steps where a melt solution of the material forming the second epitaxial layer 16 is used to remove, as by re-melting, a portion of earlier grown layers 16 and 114, a further epitaxial layer 116 (similar in composition to layer 16) can be again grown over layer 16 and mesa 13. Because layer 114 is eliminated over the mesa surface 13 and layers 6 and/or 116 are of the same conductivity as the mesa 12, no blocking pn-junction exists and greater crystal order is attained.

FIG. 7 illustrates a finished diode (produced via the first embodiment of the invention, left-hand column of FIG. 1; in the second embodiment, right-hand column of FIG. 1, no portion of layer 16 would exist above the mesa surface 13) in which further layers 17 and 18, for generating electroluminescence as well as electrodes 19 and 20 are applied in accordance with the prior art. The path of electrical current flow between electrodes 19 and 20 through the diodes is schematically indicated with the two dotted lines 22. As can be clearly seen, the current flow path 22 is restricted to the area of the mesa surface 13 because of the existence of the blocking pn-junction in the areas of the substrate surface 15, i.e., adjacent to or all the way around mesa 12 with its upper mesa surface 13.

Luminescent radiation is generated in a direction 23 from within such diode with a current flow. With a laser, such radiation can also be emitted as radiation in a lateral direction 24 (however, in contrast to FIG. 7, in a direction perpendicular to the plane of the drawing). Further electroluminescence radiation can also be emitted in yet a further direction 25, i.e., opposite to the radiation direction 23.

Emission of radiation generated due to electroluminescence normally occurs in an area of layer 17, however, laterally limited in all instances to the area of current flow, which is relatively precisely defined by mesa surface 13.

In instances where a beam emission is desired only in one direction, for example direction 23, then a mirroreflecting layer 26 can be provided on the diode structure, as shown, for reflecting other radiation, such as in direction 25, back into the desired direction.

For sake of completeness, a temperature-time diagram 80 is illustrated at FIG. 8 so as to further explain the practice of the invention. The method steps of the third and fourth level of FIG. 1, right-hand column (to attain the structure shown at FIGS. 3 and 5) are practiced such that the growth or deposition of the first epitaxial layer 114, for which a relatively steep chronological temperature gradient can be provided, occurs in the relatively short time span $t_1$ to $t_2$. The growth of the second epitaxial layer 16 occurs over a less steep temperature gradient (so that the layer thickness over the mesa surface is less) over a relatively longer time interval, $t_2$ to $t_3$. In the immediately following time interval, $t_3$ to $t_4$, the material removal step occurs by a temperature increase. As indicated earlier, with a renewed decrease of temperature, it can occur that the material from the same melt solution is first re-deposited, up through $t^*_4 \rightarrow$, as layer 116 (FIG. 6). With a further temperature reduction 85, the growth of further layers 17 and 18, which likewise follow immediately, occurs in the time intervals $t_4$ or $t^*_4$ through $t_5$ and $t_5$ through $t_6$. In accordance with known technology of shift epitaxy, respective melt solutions containing appropriate semiconductor materials to be grown, are shifted forward in the individual time intervals.

An alternative temperature-time diagram 81 is illustrated with broken lines in FIG. 8 for practicing the method steps of the second and third level of FIG. 1, left-hand column, to attain the structures shown at FIGS. 2 and 4. The growth of epitaxial layer 14 occurs over a relatively long time interval $t_1$ through $t_2$ and a relatively oblique temperature gradient so that a lower layer thickness results over the mesa surface 13. The subsequent time intervals, $t'_2$ through $t'_3$ correspond to a remelting of a sufficient portion of layer 14 to uncover the mesa surface 13 and the deposition of layer 16 occurs in the time interval $t'_3$ through $t_4$.

The initial heating of the substrate body 11 containing the mesa 12 and the melting of the respective semiconductor materials forming the various layers occurs in the time interval $t_0$ through $t_1$.

With a renewed rise in temperature progression from 80 to 80' or 81 to 81', FIG. 8 illustrates an embodiment of the invention wherein a partial remelting of the semiconductor material previously deposited as a layer, occurs.

Figure 9:
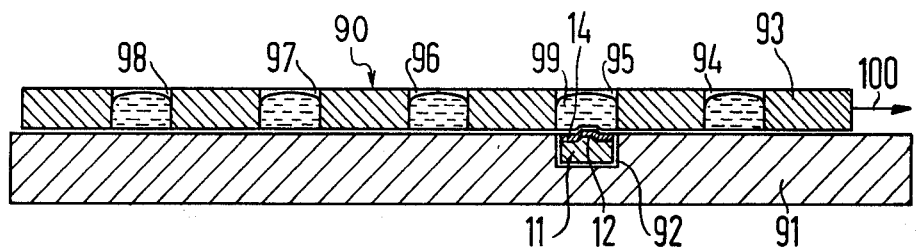
FIG. 9 is an elevated cross-sectional schematic view of an epitaxy device useful for practicing certain steps of the invention.

FIG. 9 illustrates a means for attaining this re-melting or practicing the material removal step with an additional etching melt. A known shift epitaxial device 90 is shown as having a first sliding tongue 91. The tongue 91 is provided with at least one opening 92 for accepting a substrate body 11 having a mesa 12 thereon. A second sliding tongue 93 is provided in working relation with tongue 91 and includes openings 94 through 98 for accepting selective individual melts or melt solutions. For example, a melt solution for the first epitaxial layer 14 or layer 114 can be positioned in opening 94; a melt solution for the second epitaxial layer 16 can be positioned in opening 96 and, similarly, the respective melt solutions for layers 17 and 18 can be positioned in openings 97 and 98. In certain embodiments, opening 95 can contain an etching melt 99. For example, the etching melt can be composed of a gallium or indium melt in which semiconductor material to be deposited is present in an insufficient amount so that the melt 99 has a high tendency to dissolve such semiconductor material when this etching melt comes into contact with such semiconductor material. In the illustration of FIG. 9, this is the semiconductor material of layer 14, which was previously deposited from the melt solution in opening 94 when this opening was still positioned over opening 92 and had not yet been shifted into the position shown at FIG. 9 by displacement of sliding tongue 93 in the direction of arrow 100 (relative to tongue 91). The etching melt 99 is maintained over opening 92 and thus over substrate 11 which its first epitaxial layer 14 thereon, as long as is necessary for re-melting of the semiconductor material forming an upper portion of layer 14, as was desired in detailed above. For the next step, tongue 93 is shifted in direction 100 so that opening 96 and the melt solution contained therein arrive over opening 92 in order to deposit the next layer 16. In a similar manner, each of the succeeding openings are shifted at an appropriate time over opening 92 so as to deposit their respective materials onto the structure being produced.

In the second embodiment of the invention (right-hand column of FIG. 1 and FIGS. 3 and 5) the positions of the etching melt 99 in opening 95 and of the melt solution in opening 96 are interchanged. In this manner when tongue 93 is shifted, the first epitaxial layer 114 is first deposited from the melt solution in opening 94 and upon further shifting, the second epitaxial layer 16 is then deposited from the neighboring melt solution in opening 95. Thereafter, opening 96 with the etching melt 99 is shifted over the substrate body 11, now having layers 114 and 116 thereon, for removal of material as explained earlier. Again, after appropriate material removal the next succeeding layers are deposited by appropriate shifting.

It is pointed out that the height of the mesa 12 is so slight that it does not impede the operation of a standard shift epitaxy apparatus as shown at FIG. 9.

The epitaxy apparatus shown at FIG. 9 can also be utilized to practice the embodiment of the invention discussed in conjunction with FIG. 8 whereby a re-solution or re-melting of a portion of an epitaxial layer by a melt solution which is primarily used for epitaxial deposition, occurs. In this mode, the etching melt 99 is eliminated and only the melt solutions in openings 94, 96, 97 and 98 are successively displaced with the upper sliding tongue 93 over the substrate 11 in opening 92 of the lower sliding tongue 91.

Of course, the epitaxial apparatus includes appropriate temperature control means for each of the respective openings and a means for moving the tongues relative to one another.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. In a method for producing a pn-luminescent or laser diode having an emission area in the semiconductor body of said diode defined by lateral limitations of a pn-junction wherein a plurality of semiconductor layers are epitaxially deposited onto a substrate body or on one another and electrodes are applied, the improvement comprising:
    (1) generating a mesa having side surfaces and a top plane surface dimensioned according to a desired luminescent surface area on a select semiconductor substrate of a first conductivity type;
    (2) epitaxially depositing a first layer of a semiconductor material of a second, opposing conductivity type relative to that of the substrate, onto the surfaces of the substrates and the mesa in such a manner that said first layer is generated with a lesser thickness in the area of the mesa surfaces relative to the thickness thereof on the substrate surfaces located around said mesa;
    (3) removing a sufficient portion of said first layer so that at least the entire mesa plane surface is uncovered;
    (4) epitaxially depositing a second layer of a semiconductor material of the first conductivity type on said first layer and on the uncovered plane surface of said mesa; and
    (5) thereafter applying a layer sequence required for luminescent or laser diodes and providing electrodes.

2. In a method as defined in claim 1 wherein generation of said mesa occurs by etching of said substrate body.

3. In a method as defined in claim 1 wherein said removal of a sufficient portion of said first layer occurs by erosion of said first layer with an additional etching melt.

4. In a method as defined in claim 1 wherein said removal of a sufficient portion of said first layer occurs by re-melting the material of said first layer by temporarily increasing the temperature of a melt solution used to deposit said first layer.

5. In a method as defined in claim 1 wherein said removal of a sufficient portion of said first layer occurs by re-melting of material of said first layer by temporarily increasing the temperature of a melt solution used to deposit said second layer.

6. In a method for producing a pn-luminescent or laser diode having an emission area in the semiconductor body of said diode defined by lateral limitations of a pn-junction wherein a plurality of semiconductor layers are epitaxially deposited onto a substrate body or on one another and electrodes are applied, the improvement comprising:
    (1) generating a mesa having side surfaces and a top plane surface dimensioned according to a desired luminescent surface area on a select semiconductor substrate of a first conductivity type;
    (2) epitaxially depositing a first layer composed of a further semiconductor material on an opposing, second conductivity type relative to that of the substrate, onto the surfaces of the substrate and the mesa;
    (3) epitaxially depositing a second layer of a semiconductor material of the first conductivity type onto said first layer in such a manner that the second layer is generated with a lesser thickness in the area of the mesa surfaces relative to the thickness thereof on the substrate surface;
    (4) removing a sufficient portion of said second and first layers so that at least the entire area of said mesa plane surface is uncovered; and
    (5) thereafter applying a layer sequence required for luminescent or laser diodes and providing electrodes.

7. In a method as defined in claim 6 wherein generation of said mesa occurs by etching said substrate body.

8. In a method as defined in claim 6 wherein said removal of a sufficient portion of said first and second layers occurs by erosion of said layers with an additional etching melt.

9. In a method as defined in claim 6 wherein said removal of a sufficient portion of said first and second layers occurs by re-melting the material of said layers by temporarily increasing the temperature of a melt solution used to deposit said second layer.

* * * * *

UNITED STATES PATENT AND TRADEMARK OFFICE
CERTIFICATE OF CORRECTION

PATENT NO. : 4,404,730
DATED : Sept. 20, 1983
INVENTOR(S) : Joachen Heinen

It is certified that error appears in the above—identified patent and that said Letters Patent is hereby corrected as shown below:

On the title page:
Please correct the last name of inventor to read as follows: --Heinen--.

Signed and Sealed this

Second Day of April 1985

[SEAL]

Attest:

DONALD J. QUIGG

*Attesting Officer*     *Acting Commissioner of Patents and Trademarks*